(12) United States Patent
Oh et al.

(10) Patent No.: US 11,671,101 B2
(45) Date of Patent: Jun. 6, 2023

(54) MEMORY-TYPE CAMOUFLAGED LOGIC GATE USING TRANSISTORS WITH DIFFERENT THRESHOLD VOLTAGES

(71) Applicant: ELECTRONICS AND TELECOMMUNICATIONS RESEARCH INSTITUTE, Daejeon (KR)

(72) Inventors: Jae-Mun Oh, Daejeon (KR); Byung-Do Yang, Cheongju-si (KR); Jung-Ho Kim, Cheongju-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 6 days.

(21) Appl. No.: 17/468,853

(22) Filed: Sep. 8, 2021

(65) Prior Publication Data

US 2022/0321127 A1    Oct. 6, 2022

(30) Foreign Application Priority Data

Mar. 31, 2021 (KR) .................. 10-2021-0042094

(51) Int. Cl.
*H03K 19/1776* (2020.01)
*H03K 19/17784* (2020.01)

(52) U.S. Cl.
CPC ... *H03K 19/1776* (2013.01); *H03K 19/17784* (2013.01)

(58) Field of Classification Search
None
See application file for complete search history.

(56) References Cited

U.S. PATENT DOCUMENTS

| 8,151,235 | B2 | 4/2012 | Chow et al. |
| 8,643,116 | B2 | 2/2014 | Maeda |
| 2010/0177556 | A1* | 7/2010 | Chen ............... G11C 11/412 365/156 |

FOREIGN PATENT DOCUMENTS

| KR | 10-2009-0084745 A | 8/2009 |
| KR | 10-1580196 B1 | 12/2015 |

* cited by examiner

*Primary Examiner* — Jany Richardson
(74) *Attorney, Agent, or Firm* — LRK Patent Law Firm

(57) ABSTRACT

Disclosed herein is a memory-type camouflaged logic gate using transistors having different threshold voltages. The camouflaged logic gate may include two or more candidate logic gates, memory, the output signal of which is adjusted based on two or more transistors having different threshold voltages, and a multiplexer for selectively outputting the output of one of the two or more candidate logic gates depending on the output signal of the memory.

15 Claims, 15 Drawing Sheets

MEMORY-TYPE CAMOUFLAGED LOGIC GATE USING TRANSISTORS WITH DIFFERENT THRESHOLD VOLTAGES

CROSS REFERENCE TO RELATED APPLICATION

This application claims the benefit of Korean Patent Application No. 10-2021-0042094, filed Mar. 31, 2021, which is hereby incorporated by reference in its entirety into this application.

BACKGROUND OF THE INVENTION

1. Technical Field

The disclosed embodiment relates to technology for preventing the theft of design techniques in the semiconductor circuit design field.

2. Description of Related Art

Reverse engineering is used not only as a method for attacking chips but also as a tool for manufacturing cloned chips after easily stealing the circuit diagrams (netlists) of commercial chips.

Through reverse engineering, a packaged Integrated Chip (IC) is disassembled and analyzed, images thereof are extracted, and the netlist thereof is acquired. Such a reverse engineering process employs a delayering method by which a complete IC chip, from which the package (mold) thereof is removed using a chemical substance or special equipment, is disassembled into layers. Here, the images of the respective layers of the silicon chip, which are exposed through the delayering method, are captured using a scanning electron microscope (SEM) or a transmission electron microscope (TEM). These nanometer (nm)-scale images are arranged and combined, and an automated tool analyzes the models of the respective layers and constructs a functional model of the chip, thereby creating a netlist and a hierarchical Register Transfer Level (RTL).

Such reverse engineering technology is advanced, which results in the release of an automated program, whereby the time taken to produce counterfeit chips is reduced.

SUMMARY OF THE INVENTION

An object of the disclosed embodiment is to provide a camouflage technique by which chip theft using reverse engineering is prevented.

Another object of the disclosed embodiment is to overcome constraints, such as a change in a circuit design process and the like, which are imposed when a conventional camouflage technique for preventing circuit theft in response to reverse engineering is applied to a general process.

A further object of the disclosed embodiment is to prevent an increase in the area of a chip, an increase in power consumption, and performance degradation due to a long delay time, which are caused due to a conventional camouflage technique for preventing circuit theft in response to reverse engineering.

Yet another object of the disclosed embodiment is to facilitate interfacing with other logic through a static operation.

Still another object of the disclosed embodiment is to prevent a conventional camouflage technique, which is applied for preventing circuit theft in response to reverse engineering, from increasing the price of a chip.

A camouflaged logic gate according to an embodiment may include two or more candidate logic gates, memory, the output signal of which is adjusted based on two or more transistors having different threshold voltages, and a multiplexer for selectively outputting the output of one of the two or more candidate logic gates depending on the output signal of the memory.

Here, when the output signal of the memory is N bits, the number of candidate logic gates may be equal to or less than $2^N$.

Here, the memory may include at least one memory cell, the memory cell may include a first P-channel transistor, a second P-channel transistor, a first N-channel transistor, and a second N-channel transistor, and respective threshold voltages of the first P-channel transistor and the second P-channel transistor may be different from each other, or respective threshold voltages of the first N-channel transistor and the second N-channel transistor may be different from each other.

Here, the memory cell may be configured such that power is applied to respective sources of the first P-channel transistor and the second P-channel transistor, respective drains of the first P-channel transistor and the first N-channel transistor, which are electrically connected to each other, form an output terminal (Q), respective drains of the second P-channel transistor and the second N-channel transistor, which are electrically connected to each other, form an inverted output terminal (Qb), respective sources of the first N-channel transistor and the second N-channel transistor are grounded, the inverted output terminal (Qb) is electrically connected to respective gates of the first P-channel transistor and the first N-channel transistor, and the output terminal (Q) is electrically connected to respective gates of the second P-channel transistor and the second N-channel transistor.

Here, the multiplexer may include a first transmission gate for switching a first candidate logic gate by being configured such that the control terminal thereof is electrically connected to the output terminal (Q) and the inverted output terminal (Qb) of the memory cell and a second transmission gate for switching a second candidate logic gate by being configured such that the control terminal thereof is electrically connected to the inverted output terminal (Qb) and the output terminal (Q) of the memory cell.

A camouflaged candidate logic gate according to an embodiment may include a memory cell, configured such that the values of an output terminal (Q) and an inverted output terminal (Qb) thereof are adjusted to a high level or a low level based on two or more transistors having different threshold voltages, and a select-type logic gate for selectively operating as one of two or more candidate logic gates depending on the values of the output terminal (Q) and the inverted output terminal (Qb) of the memory cell by being configured with multiple transistors.

Here, the memory cell may include a first P-channel transistor, a second P-channel transistor, a first N-channel transistor, and a second N-channel transistor, and respective threshold voltages of the first P-channel transistor and the second P-channel transistor may be different from each other, or respective threshold voltages of the first N-channel transistor and the second N-channel transistor may be different from each other.

Here, the memory cell may be configured such that power is applied to respective sources of the first P-channel transistor and the second P-channel transistor, respective drains of the first P-channel transistor and the first N-channel transistor, which are electrically connected to each other, form the output terminal (Q), respective drains of the second P-channel transistor and the second N-channel transistor, which are electrically connected to each other, form the inverted output terminal (Qb), respective sources of the first N-channel transistor and the second N-channel transistor are grounded, the inverted output terminal (Qb) is electrically connected to respective gates of the first P-channel transistor and the first N-channel transistor, and the output terminal (Q) is electrically connected to respective gates of the second P-channel transistor and the second N-channel transistor.

Here, the select-type logic gate may be configured to output a result of a logic operation performed on two input signals or three input signals and to selectively operate as one of a NAND gate and a NOR gate depending on at least one of the signals of the output terminal (Q) and the inverted output terminal (Qb) of the memory cell.

Here, the select-type logic gate may include first to fifth P-channel transistors and first to fifth N-channel transistors, and may be configured such that power is applied to the source of the first P-channel transistor and the source of the second P-channel transistor, the drain of the first P-channel transistor, the source of the third P-channel transistor, and the source of the fourth P-channel transistor are electrically connected to each other, the drain of the second P-channel transistor, the drain of the third P-channel transistor, and the source of the fifth P-channel transistor are electrically connected to each other, the drain of the fourth P-channel transistor, the drain of the fifth P-channel transistor, the drain of the first N-channel transistor, and the drain of the second N-channel transistor, which are electrically connected to each other, form the output terminal (OUT) of the select-type logic gate, the source of the first N-channel transistor, the drain of the third N-channel transistor, and the drain of the fourth N-channel transistor are electrically connected to each other, the source of the second N-channel transistor, the source of the third N-channel transistor, and the drain of the fifth N-channel transistor are electrically connected to each other, the source of the fourth N-channel transistor and the source of the fifth N-channel transistor are grounded, the first one (A) of the two input signals is input to respective gates of the fourth P-channel transistor and the first N-channel transistor, the second one (B) of the two input signals is input to respective gates of the second P-channel transistor and the fifth N-channel transistor, the output terminal (Q) of the memory cell is electrically connected to respective gates of the third P-channel transistor and the third N-channel transistor, and the inverted output terminal (Qb) of the memory cell is electrically connected to respective gates of the first P-channel transistor, the fifth P-channel transistor, the second N-channel transistor and the fourth N-channel transistor.

Here, the select-type logic gate may include first to ninth P-channel transistors and first to ninth N-channel transistors, and may be configured such that power is applied to the source of the first P-channel transistor, the source of the second P-channel transistor, and the source of the sixth P-channel transistor, the drain of the first P-channel transistor, the source of the third P-channel transistor, and the source of the fourth P-channel transistor are electrically connected to each other, the drain of the second P-channel transistor, the drain of the third P-channel transistor, and the source of the fifth P-channel transistor are electrically connected to each other, the drain of the fifth P-channel transistor, the source of the seventh P-channel transistor, and the source of the eighth P-channel transistor are electrically connected to each other, the drain of the sixth P-channel transistor, the drain of the seventh P-channel transistor, and the source of the ninth P-channel transistor are electrically connected to each other, the drain of the fourth P-channel transistor, the drain of the eighth P-channel transistor, the drain of the ninth P-channel transistor, the drain of the first N-channel transistor, the drain of the second N-channel transistor, and the drain of the sixth N-channel transistor, which are electrically connected to each other, form the output terminal (OUT) of the select-type logic gate, the source of the first N-channel transistor and the drain of the third N-channel transistor and the drain of the fourth N-channel transistor are electrically connected to each other, the source of the second N-channel transistor, the source of the third N-channel transistor, and the drain of the fifth N-channel transistor are electrically connected to each other, the source of the fifth N-channel transistor, the source of the seventh N-channel transistor, and the drain of the eighth N-channel transistor are electrically connected to each other, the source of the sixth N-channel transistor and one of the source of the seventh N-channel transistor and the drain of the ninth N-channel transistor are electrically connected to each other, the source of the fourth N-channel transistor, the source of the eighth N-channel transistor, and the source of the ninth N-channel transistor are grounded, the first one (A) of the three input signals is input to respective gates of the first P-channel transistor and the first N-channel transistor, the second one (B) of the three input signals is input to respective gates of the fifth P-channel transistor and the fifth N-channel transistor, the third one (C) of the three input signals is input to respective gates of the ninth P-channel transistor and the ninth N-channel transistor, the output terminal (Q) of the memory cell is electrically connected to respective gates of the third P-channel transistor, the seventh P-channel transistor, the third N-channel transistor, and the seventh N-channel transistor, and the inverted output terminal (Qb) of the memory cell is electrically connected to respective gates of the second P-channel transistor, the fourth P-channel transistor, the sixth P-channel transistor, the eighth P-channel transistor, the second N-channel transistor, the fourth N-channel transistor, the sixth N-channel transistor, and the eighth N-channel transistor.

Here, the select-type logic gate may be configured to output a result of a logic operation performed on two input signals or three input signals and to selectively operate as one of a NAND gate and an XOR gate depending on at least one of the signals of the output terminal (Q) and the inverted output terminal (Qb) of the memory cell.

Here, the select-type logic gate may include first to fifth P-channel transistors and first to fifth N-channel transistors, and may be configured such that power is applied to the source of the first P-channel transistor and the source of the second P-channel transistor, the drain of the first P-channel transistor, the drain of the second P-channel transistor, the source of the third P-channel transistor, the source of the fourth P-channel transistor, and the source of the fifth P-channel transistor are electrically connected to each other, the drain of the third P-channel transistor, the drain of the fourth P-channel transistor, the drain of the fifth P-channel transistor, the drain of the first N-channel transistor, and the drain of the third N-channel transistor, which are electrically connected to each other, form the output terminal (OUT) of the select-type logic gate, the source of the first N-channel transistor and the drain of the second N-channel transistor are electrically connected to each other, the source of the third N-channel transistor and the drain of the fourth N-channel transistor are electrically connected to each other, the source of the fourth N-channel transistor and the drain of the fifth N-channel transistor are electrically connected to each other, the source of the second N-channel transistor and the source of the fifth N-channel transistor are grounded, the first one (A) of the two input signals is input to respective gates of the first P-channel transistor and the first N-channel transistor, the inverted signal (Ab) of the first one of the two input signals is input to respective gates of the third P-channel transistor and the fourth N-channel transistor, the second one (B) of the two input signals is input to respective gates of the second P-channel transistor and the second N-channel transistor, the inverted signal (Bb) of the second one of the two input signals is input to respective gates of the fourth P-channel transistor and the fifth N-channel transistor, and the output terminal (Q) of the memory cell is electrically connected to respective gates of the fifth P-channel transistor and the third N-channel transistor.

Here, the select-type logic gate may be configured to output a result of a logic operation performed on two input signals or three input signals and to selectively operate as one of a NOR gate and an XOR gate depending on at least one of the signals of the output terminal (Q) and the inverted output terminal (Qb) of the memory cell.

Here, the select-type logic gate may include first to fifth P-channel transistors and first to fifth N-channel transistors, and may be configured such that power is applied to the source of the first P-channel transistor and the source of the third P-channel transistor, the drain of the first P-channel transistor and the source of the second P-channel transistor are electrically connected to each other, the drain of the third P-channel transistor and the source of the fourth P-channel transistor are electrically connected to each other, the drain of the fourth P-channel transistor and the source of the fifth P-channel transistor are electrically connected to each other, the drain of the second P-channel transistor, the drain of the fifth P-channel transistor, the drain of the first N-channel transistor, the drain of the second N-channel transistor, and the drain of the third N-channel transistor, which are electrically connected to each other, form the output terminal (OUT) of the select-type logic gate, the source of the first N-channel transistor, the source of the second N-channel transistor, the source of the third N-channel transistor, the drain of the fourth N-channel transistor, and the drain of the fifth N-channel transistor are electrically connected to each other, the source of the fourth N-channel transistor and the source of the fifth N-channel transistor are grounded, the first one (A) of the two input signals is input to respective gates of the second P-channel transistor and the fourth N-channel transistor, the inverted signal (Ab) of the first one of the two input signals is input to respective gates of the fourth P-channel transistor and the first N-channel transistor, the second one (B) of the two input signals is input to respective gates of the first P-channel transistor and the fifth N-channel transistor, the inverted signal (Bb) of the second one of the two input signals is input to respective gates of the third P-channel transistor and the second N-channel transistor, and the output terminal (Q) of the memory cell is electrically connected to respective gates of the fifth P-channel transistor and the third N-channel transistor.

A memory cell according to an embodiment may include a first P-channel transistor, a second P-channel transistor, a first N-channel transistor, and a second N-channel transistor, and respective threshold voltages of the first P-channel transistor and the second P-channel transistor may be different from each other, or respective threshold voltages of the first N-channel transistor and the second N-channel transistor may be different from each other.

Here, the memory cell may be configured such that power is applied to respective sources of the first P-channel transistor and the second P-channel transistor, respective drains of the first P-channel transistor and the first N-channel transistor, which are electrically connected to each other, form an output terminal (Q), respective drains of the second P-channel transistor and the second N-channel transistor, which are electrically connected to each other, form an inverted output terminal (Qb), respective sources of the first N-channel transistor and the second N-channel transistor are grounded, the inverted output terminal (Qb) is electrically connected to respective gates of the first P-channel transistor and the first N-channel transistor, and the output terminal (Q) is electrically connected to respective gates of the second P-channel transistor and the second N-channel transistor.

BRIEF DESCRIPTION OF THE DRAWINGS

The above and other objects, features, and advantages of the present invention will be more clearly understood from the following detailed description taken in conjunction with the accompanying drawings, in which.

DESCRIPTION OF THE PREFERRED EMBODIMENTS

Figure 1:
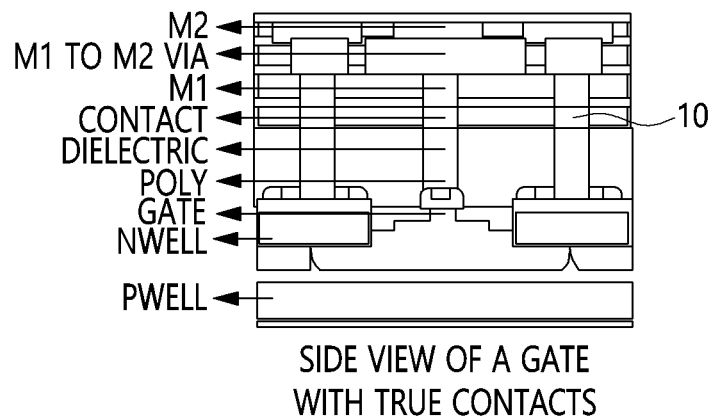
FIG. 1 is an exemplary view illustrating true contacts.

The advantages and features of the present invention and methods of achieving the same will be apparent from the exemplary embodiments to be described below in more detail with reference to the accompanying drawings. However, it should be noted that the present invention is not limited to the following exemplary embodiments, and may be implemented in various forms. Accordingly, the exemplary embodiments are provided only to disclose the present invention and to let those skilled in the art know the category of the present invention, and the present invention is to be defined based only on the claims. The same reference numerals or the same reference designators denote the same elements throughout the specification.

It will be understood that, although the terms "first," "second," etc. may be used herein to describe various elements, these elements are not intended to be limited by these terms. These terms are only used to distinguish one element from another element. For example, a first element discussed below could be referred to as a second element without departing from the technical spirit of the present invention.

The terms used herein are for the purpose of describing particular embodiments only, and are not intended to limit the present invention. As used herein, the singular forms are intended to include the plural forms as well, unless the context clearly indicates otherwise. It will be further understood that the terms "comprises," "comprising,", "includes" and/or "including," when used herein, specify the presence of stated features, integers, steps, operations, elements, and/or components, but do not preclude the presence or addition of one or more other features, integers, steps, operations, elements, components, and/or groups thereof.

Unless differently defined, all terms used herein, including technical or scientific terms, have the same meanings as terms generally understood by those skilled in the art to which the present invention pertains. Terms identical to those defined in generally used dictionaries should be interpreted as having meanings identical to contextual meanings of the related art, and are not to be interpreted as having ideal or excessively formal meanings unless they are definitively defined in the present specification.

Hereinafter, a memory-type camouflaged logic gate using transistors having different threshold voltages according to an embodiment will be described in detail with reference to FIGS. 1 to 27.

First, a silicon camouflage cell technique, a dummy-contact-based camouflage technique, and a threshold-voltage-dependent dynamic method, which are camouflage techniques for preventing reverse-engineering-based circuit theft, will be described below in order to help understanding of the present invention.

1. Silicon Camouflage Cell Technique

The Rambus corporation has devised a silicon camouflage cell using thin layers of wires that are indistinguishable through delayering when a semiconductor circuit is analyzed through reverse engineering. Such camouflage cells may be determined to be the same cells as cells provided in a foundry when they are analyzed through reverse engineering, but to operate differently from basic cells.

However, the silicon camouflage cell technique requires that a thin-film layer be used for circuit design. This thin layer is silicide, which requires a change in the order of a general process. Also, depending on the circumstances, an additional process may be required, and update of a Process Design Kit (PDK) may be required in order to incorporate the corresponding layer in the design. Accordingly, it is necessary to collaborate with the entity responsible for the process. However, matters, such as yield, cost, and the like, may make it difficult to collaborate, and even if such collaboration succeeds, additional costs may be incurred.

2. Dummy-Contact-Based Camouflage Technique

In a paper published in 2013 and titled "Security Analysis of Integrated Circuit Camouflaging", implementation of a camouflaged logic gate using a true contact and a dummy contact has been suggested.

Figure 2:
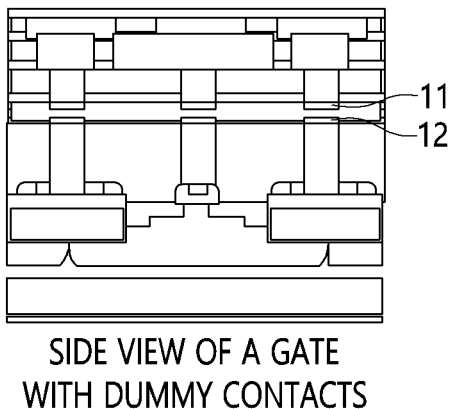
FIG. 2 is an exemplary view illustrating dummy contacts.
Figure 3:
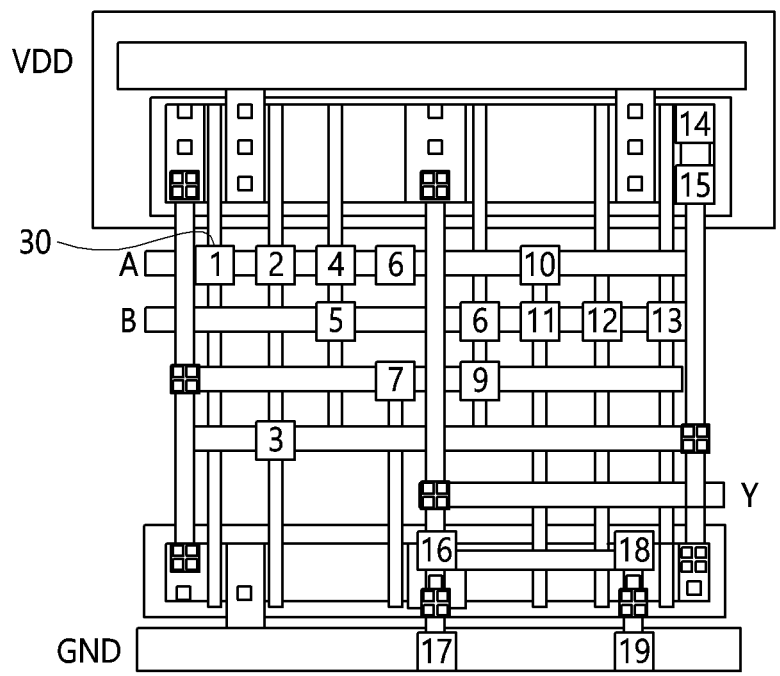
FIG. 3 is an exemplary view illustrating a layout to which a dummy-contact-based camouflage technique is applied.

FIG. 1 is an exemplary view illustrating true contacts, FIG. 2 is an exemplary view illustrating dummy contacts, and FIG. 3 is an exemplary view illustrating a layout to which a dummy-contact-based camouflage technique is applied.

Referring to FIG. 1, in the case of true contacts, the contacts 10 are present between an M1 layer and a poly layer.

Referring to FIG. 2, in the case of a dummy contact, the contact is divided into two parts 11 and 12, and a dielectric material fills the gap therebetween. Accordingly, the dummy contact looks the same as the true contact in top view, but layers cannot be connected thereby, so a camouflaged logic gate may be implemented.

By applying the above-described dummy contact, the three types of logic gates shown in Table 1 below may be formed so as to have the same layout illustrated in FIG.

TABLE 1

| | CONTACTS | |
| FUNCTION | TRUE | DUMMY |
| --- | --- | --- |
| NAND | 2, 4, 6, 8, 11, 12, 16, 17 | 1, 3, 5, 7, 9, 10, 13, 14, 15, 18, 19 |
| NOR | 2, 4, 6, 11, 12, 18, 19 | 1, 3, 5, 7, 8, 9 10, 13, 14, 15, 16, 17 |
| XOR | 1, 3, 4, 7, 9, 10, 12, 13, 14, 15, 18, 19 | 2, 5, 6, 8, 11, 16, 17 |

When the true contacts and the dummy contacts are configured as shown in Table 1 above, the camouflaged cell illustrated in FIG. 3 may operate as NAND, NOR, or XOR.

However, implementation of such a dummy-contact-based camouflage technique requires that configuration of a dummy contact be possible. For example, additional processes for at least three masks are required, matters related thereto have to be supported by the entity involved in the process under consultation with the entity, and additional costs are incurred when such matters are supported.

Also, because the camouflaged cells using dummy contacts have a larger area than basic cells, a circuit using the dummy contacts increases the area of a chip, which results in an increase in the price of the chip. Further, a long and complex connection line increases a delay, which degrades the performance of the chip.

3. Threshold-Voltage-Dependent Dynamic Camouflage Technique

The paper published in 2016 and titled "Threshold-Dependent Camouflaged Cells to Secure Circuits Against Reverse Engineering Attack" has suggested the implementation of a camouflaged circuit using a difference between threshold voltages (Vth).

Figure 4:
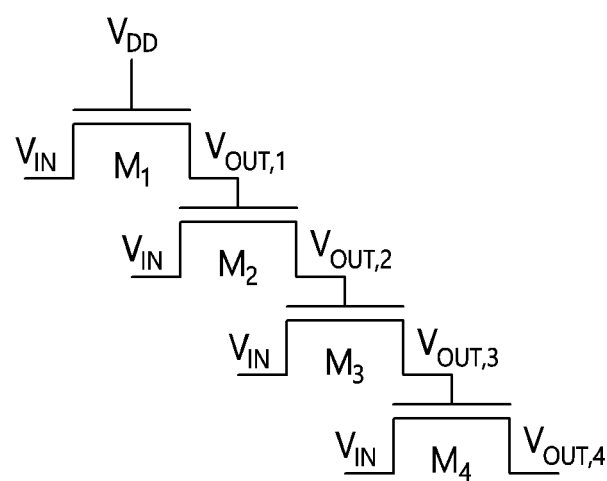
FIG. 4 is an exemplary view illustrating a circuit in which a threshold-voltage-dependent dynamic camouflage technique is implemented.
Figure 5:
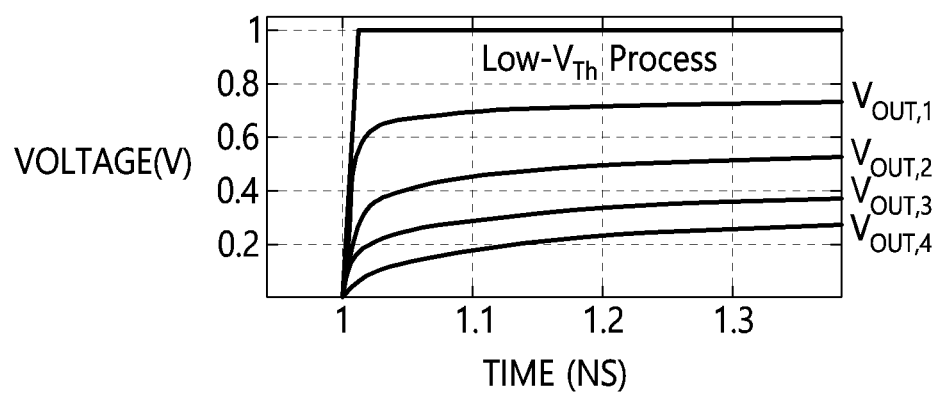
FIG. 5 and FIG. 6 are exemplary views illustrating the graphs of output voltages depending on a threshold voltage.
Figure 6:
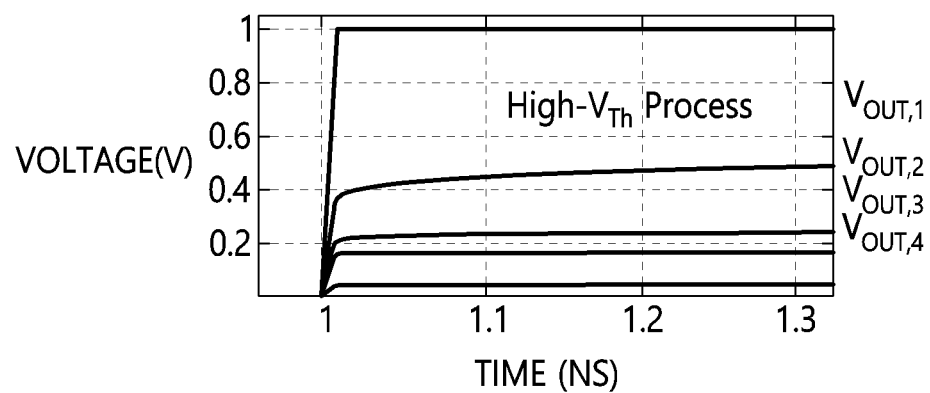

FIG. 4 is an exemplary view of a circuit in which a threshold-voltage-dependent dynamic camouflage technique is implemented, and FIG. 5 and FIG. 6 are exemplary views of the graphs of output voltages depending on threshold voltages.

Referring to FIG. 4, when four N-channel transistors (N-MOSFETs) are connected in cascade, the output voltage $V_{OUT}$ of each of the transistors falls by $V_{TH}$ across each transistor. That is, it can be seen that, when $V_{DD}$ is applied to the terminal VIN of a cascade of four ideal NMOSs, the output voltage $V_{OUT.1}$ of $M_1$ becomes $V_{DD}-V_{TH}$, the output voltage $V_{OUT.2}$ of $M_2$ becomes $V_{DD}-2V_{TH}$ as demonstrated by solving $(V_{DD}-V_{TH})-V_{TH}$, the output voltage $V_{OUT.3}$ of $M_3$ becomes $V_{DD}-3V_{TH}$ as demonstrated by solving $(V_{DD}-2V_{TH})-V_{TH}$, and the final output voltage $V_{OUT.4}$ of $M_4$ becomes $V_{DD}-4V_{TH}$ as demonstrated by solving $(V_{DD}-3V_{TH})-V_{TH}$.

Here, referring to FIG. 5 and FIG. 6, the output voltage may change depending on whether the threshold voltage is Low $V_{th}$ or High $V_{th}$. Here, Low $V_{th}$ and High $V_{th}$ are dependent on a doping concentration, and it is impossible to identify these through reverse engineering. Accordingly, the output voltage of $M_n$ in a cascade of n NMOSs may change depending on the manufacturing process, and thus a camouflaged gate may be created.

Figure 7:
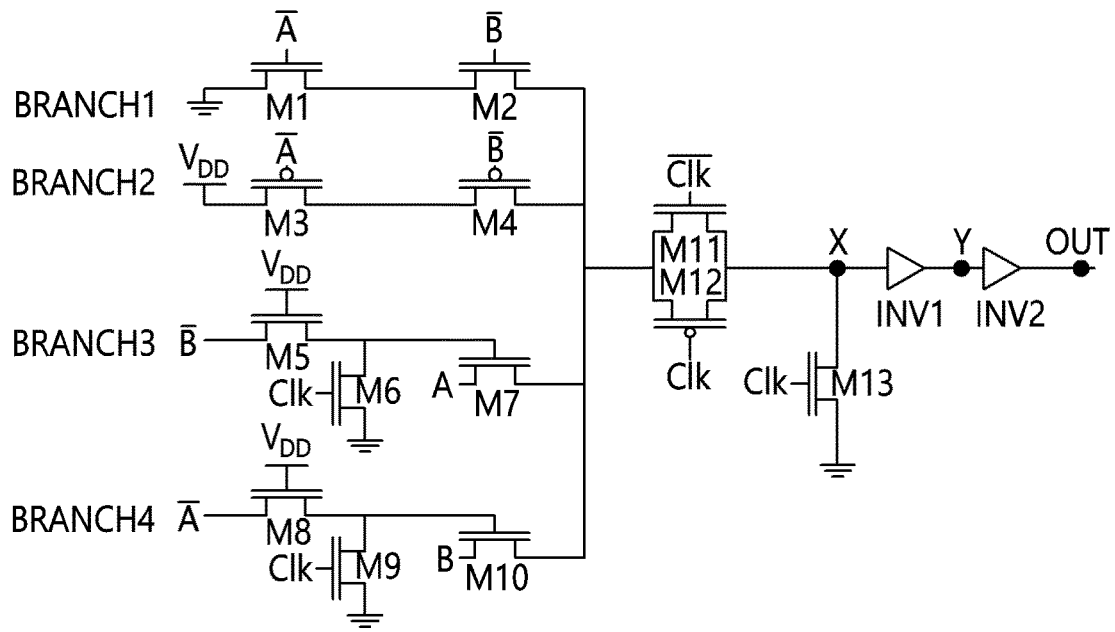
FIG. 7 is an exemplary view illustrating a threshold-voltage-dependent camouflaged gate circuit.

For example, using the principle in which Low $V_{th}$ or High $V_{th}$ is selected by adjusting a doping concentration during the manufacturing process, the threshold-dependent camouflaged gate illustrated in FIG. 7 may be generated.

Figure 8:
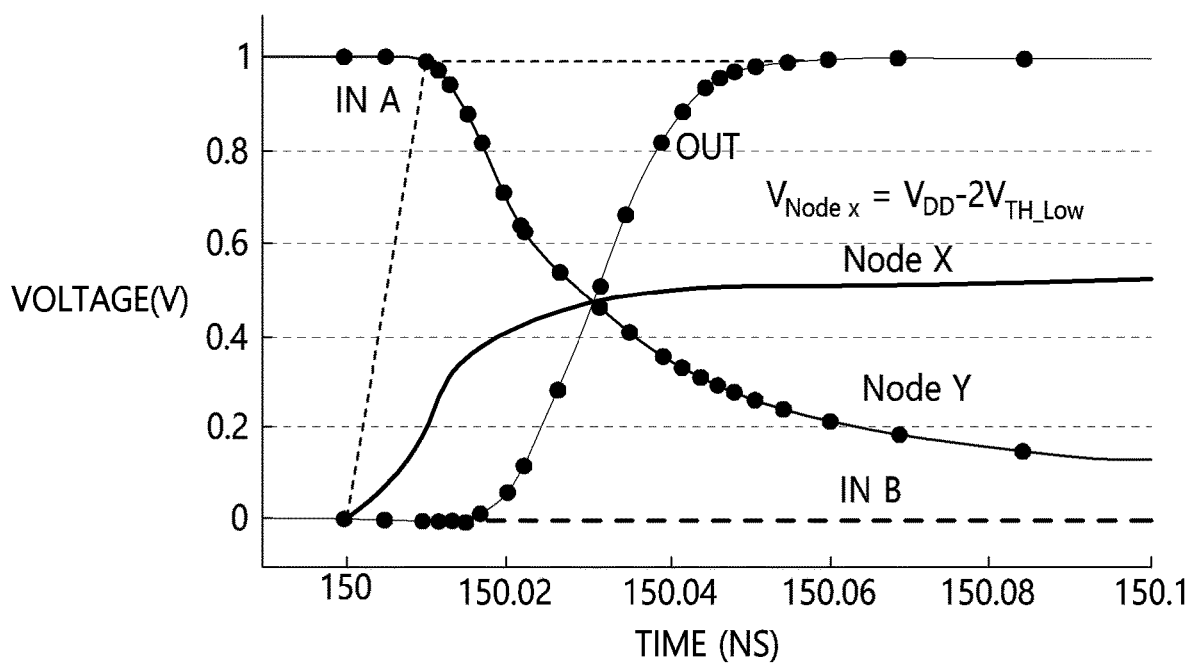
FIG. 8 and FIG. 9 are exemplary views illustrating the graphs of operation waveforms of a threshold-voltage-dependent camouflaged gate circuit.
Figure 9:
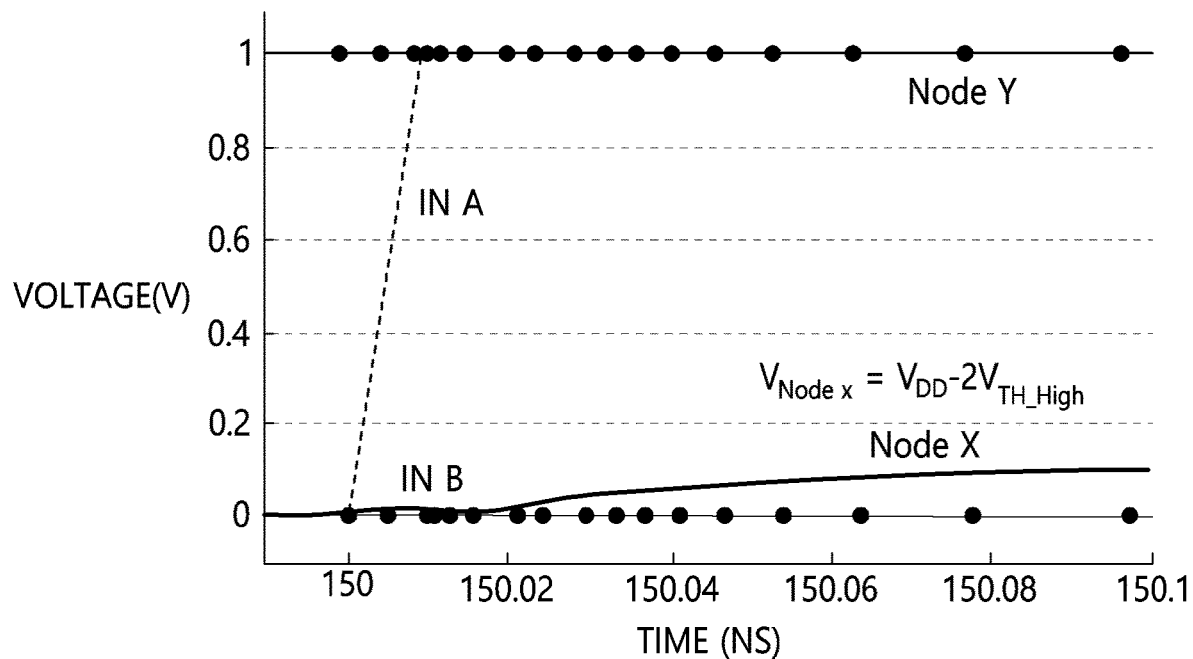

FIG. 7 is an exemplary view of a threshold-voltage-dependent camouflaged gate circuit, and FIG. 8 and FIG. 9 are exemplary views of the graphs of the operation waveform of a threshold-voltage-dependent camouflaged gate circuit.

Referring to FIG. 7, a threshold-voltage-dependent dynamic camouflaged gate circuit operates as an AND gate when MOSFETs use High $V_{TH}$, but operates as an OR gate when they use Low $V_{TH}$. Branch1 and Branch2 have a structure in which NMOSs are connected in series, and are configured such that, by $V_{DD}$ and GND, they have output of '0' when input A=B='0', but have output of '1' when input A=B='1', regardless of LVT (Low Voltage Threshold) and HVT (High Voltage Threshold) of the MOSFETs.

Referring to FIG. 8, when Low $V_{TH}$ is applied to Branch3, input A changes from '0' to '1', and when input B is '0', the voltage at node X increases to 0.45V. As a result, the voltage at node Y decreases to 0.2V, and the circuit operates like an OR gate.

In contrast, referring to FIG. 9, when High $V_{TH}$ is applied to Branch3, input A changes from '0' to '1', and when input B is '0', the voltage at node X increases up to 0.11V. As a result, the voltage at node Y maintains at '1', and the circuit operates like an AND gate. This operation may be the same as in Branch4. Also, noise is reduced by adding an inverter to the final terminal.

AND/OR operations depending on whether an LVT or HVT MOSFET is used may be confirmed with reference to the truth table illustrated in Table 2 below.

TABLE 2

| INPUT | | OUTPUT | |
|---|---|---|---|
| A | B | LVT | HVT |
| 0 | 0 | 0 | 0 |
| 0 | 1 | 1 | 0 |
| 1 | 0 | 1 | 0 |
| 1 | 1 | 1 | 1 |

However, the threshold-voltage-dependent dynamic camouflaged gate has a complicated circuit, including three NOT gates for inverting input signals A, B and CLK, and a total of 23 transistors, as described above. Also, due to a dynamic operation based on the clock signal CLK, it is difficult to realize compatibility with other static logic, and there are problems of high power consumption, a large area, and a long delay time.

All of the above-described camouflage techniques for preventing reverse-engineering-based circuit theft have obvious limitations. The present invention proposes a memory-type camouflaged logic gate using transistors having different threshold voltages, as a camouflage technique for overcoming the above-described limitations.

Figure 10:
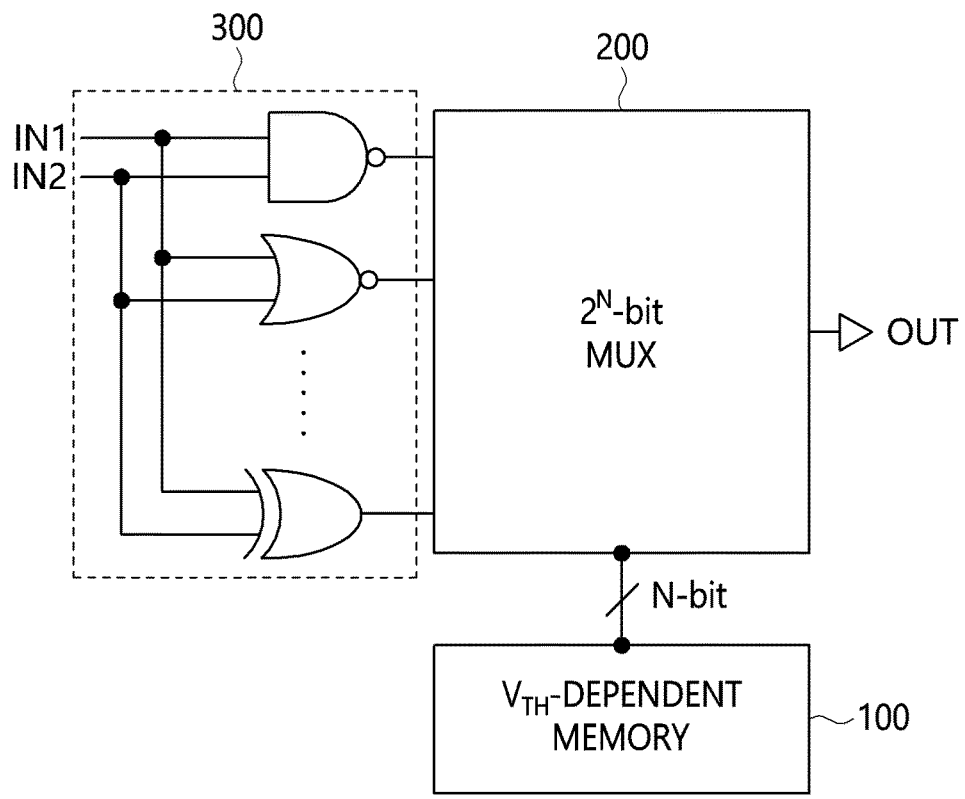
FIG. 10 is an exemplary view illustrating the structure of a memory-type camouflaged logic gate using transistors having different threshold voltages according to an embodiment.

FIG. 10 is an exemplary view illustrating the structure of a memory-type camouflaged logic gate using transistors having different threshold voltages according to an embodiment.

Referring to FIG. 10, the memory-type camouflaged logic gate using the difference of threshold voltages according to an embodiment may include memory 100, a multiplexer 200, and two or more logic gates 300.

The memory 100 is configured by combining two or more transistors having different threshold voltages, whereby the output signal thereof may be adjusted depending on the threshold voltages.

Here, the threshold voltage is a voltage at an inflection point, at which the channel of a transistor is changed to an ON state when a gate voltage increases.

Here, when the output signal of the memory 100 is N bits, the number of candidate logic gates 300 may be equal to or less than $2^N$.

Here, the memory 100 includes at least one memory cell, and the detailed configuration and operation of the memory cell will be described later with reference to FIGS. 11 to 18.

The multiplexer 200 according to an embodiment may select the output of one of the two or more candidate logic gates 300 depending on the output signal of the memory 100. That is, predetermined bits of memory data are taken as a select signal, and the output of at least one of the multiple candidate logic gates included in the logic gate unit 300 may be selected based thereon.

Accordingly, a logic gate may be camouflaged by selecting one of the multiple candidate logic gates based on the memory data, which is changed depending on the threshold voltages of the transistors included in the memory 100, whereby an attack on a chip through reverse engineering becomes impossible.

Figure 11:
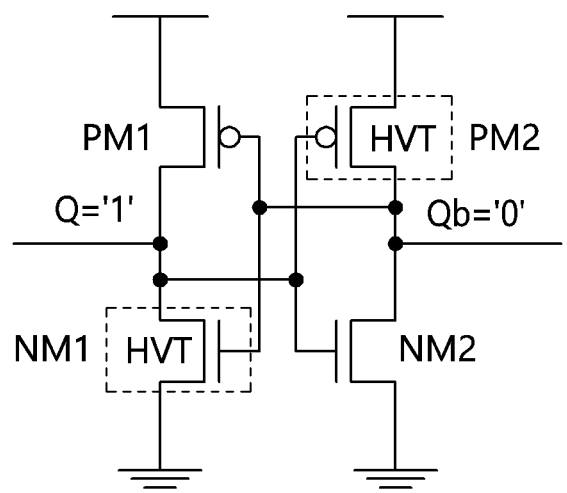
FIG. 11 is an exemplary view illustrating the structure of a memory cell according to an embodiment.

FIG. 11 is an exemplary view illustrating the structure of a memory cell according to an embodiment. However, FIG. 11 is an embodiment of the present invention, and the present invention is not limited thereto. That is, a memory cell may have a different circuit configuration so as to generate memory data by diversely combining multiple transistors having different threshold voltages.

Referring to FIG. 11, the memory cell may be configured as a latch circuit including a first P-channel transistor (P-MOSFET) PM1, a second P-channel transistor (P-MOSFET) PM2, a first N-channel transistor (N-MOSFET) NM1, and a second N-channel transistor (N-MOSFET) NM2.

That is, according to an embodiment, power may be applied to the source of the first P-channel transistor PM1 and the source of the second P-channel transistor PM2.

The drain of the first N-channel transistor NM1 and the drain of the first P-channel transistor PM1 are electrically connected to each other, thereby forming the output terminal Q. Also, the drain of the second N-channel transistor NM2 and the drain of the second P-channel transistor PM2 are electrically connected to each other, thereby forming the inverted output terminal Qb.

The source of the first N-channel transistor NM1 and the source of the second N-channel transistor NM2 may be grounded.

The inverted output terminal Qb may be electrically connected to the respective gates of the first P-channel transistor PM1 and the first N-channel transistor NM1, and the output terminal Q may be electrically connected to the respective gates of the second P-channel transistor PM2 and the second N-channel transistor NM2.

Here, the first P-channel transistor PM1 and the second P-channel transistor PM2 may be turned on (the channels thereof may be changed to an ON state) by different threshold voltages.

Alternatively, the first N-channel transistor NM1 and the second N-channel transistor NM2 may be turned on (the channels thereof may be changed to an ON state) by different threshold voltages.

Here, the threshold voltage may be one of a Normal Threshold Voltage (NVT), a Low Threshold Voltage (LVT) lower than the NVT, and a High Threshold Voltage (HVT) higher than the NVT.

Figure 12:
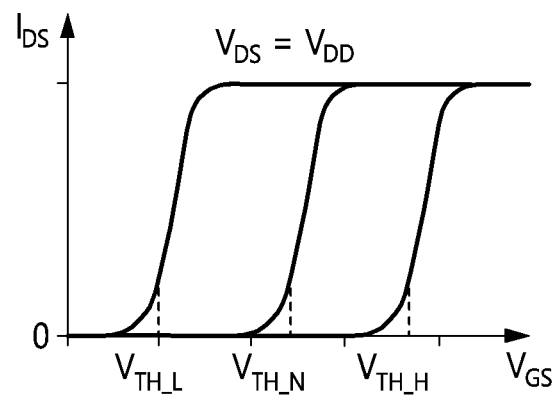
FIG. 12 is a graph illustrating a change in the current of a transistor depending on a threshold voltage.

FIG. 12 is a graph illustrating a change in the current of a transistor depending on a threshold voltage.

Referring to FIG. 12, because the current IDS flowing in a transistor increases in reverse proportion to the magnitude of the threshold voltage, the amount of current flowing in the transistor may be adjusted depending on the threshold voltage.

Accordingly, when transistors having different threshold voltages are differently arranged, the values of the output terminal Q and the inverted output terminal Qb of a latch may be respectively set to '1', which is a high level (HL), and '0', which is a low level (LL), or may be respectively set to '0', which is a low level (LL), and '1', which is a high level (HL).

Figure 13:
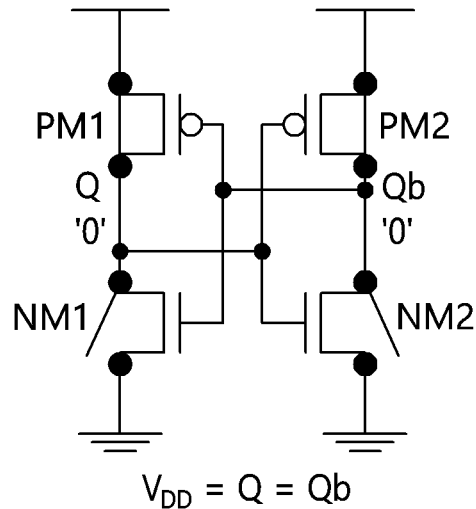
FIG. 13 is an exemplary view illustrating the initial state of a memory cell according to an embodiment.
Figure 14:
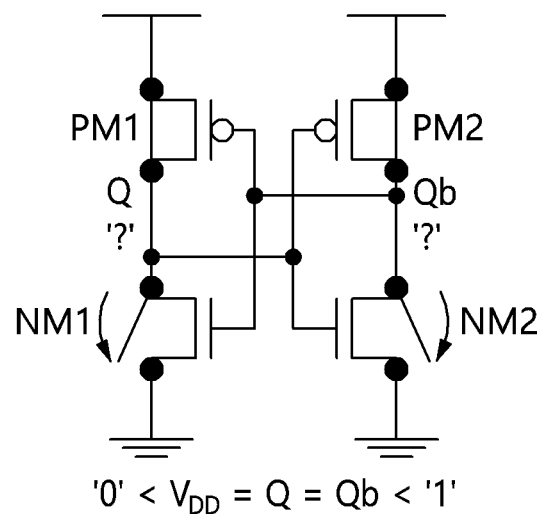
FIG. 14 is an exemplary view illustrating the transient state of a memory cell according to an embodiment.
Figure 15:
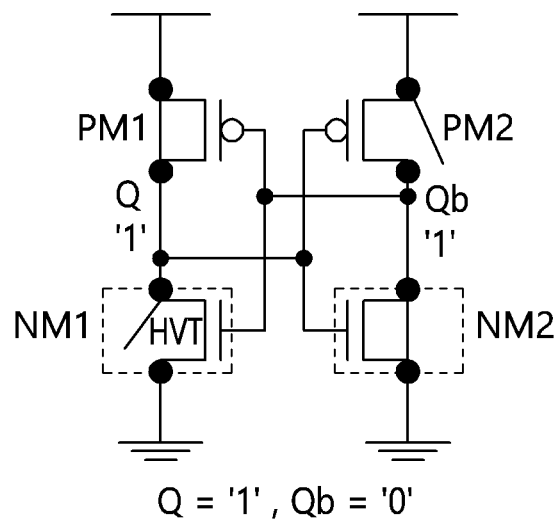
FIG. 15 and FIG. 17 are exemplary views illustrating the final state of a memory cell according to an embodiment.
Figure 16:
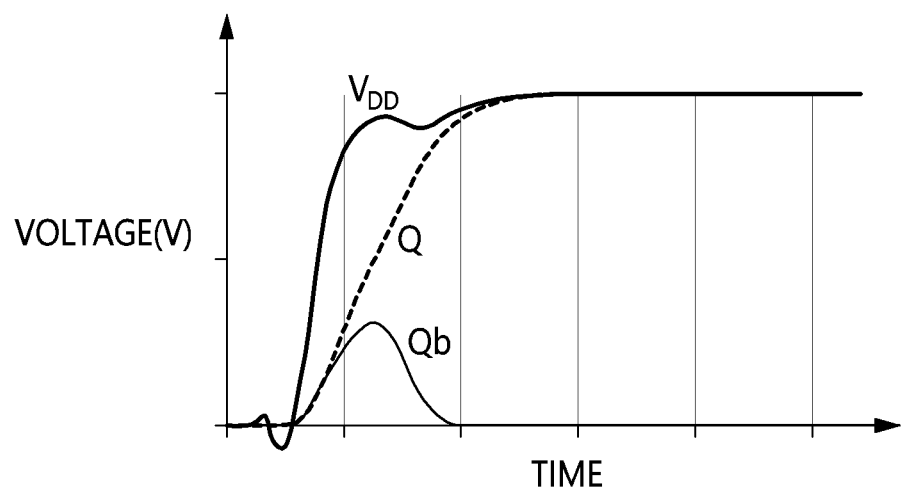
FIG. 16 and FIG. 18 are graphs illustrating changes in voltages at an output terminal and an inverted output terminal over time after a voltage is applied according to an embodiment.
Figure 17:
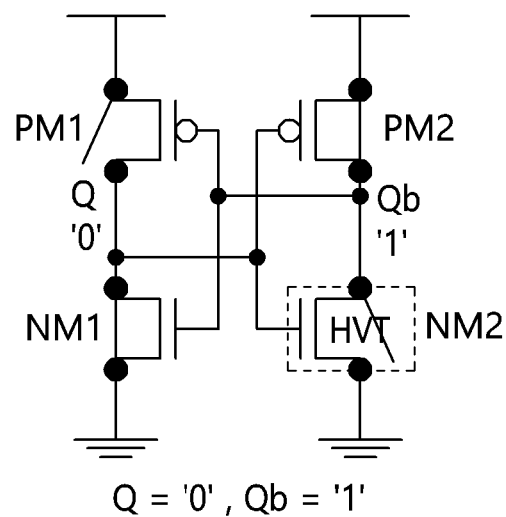
Figure 18:
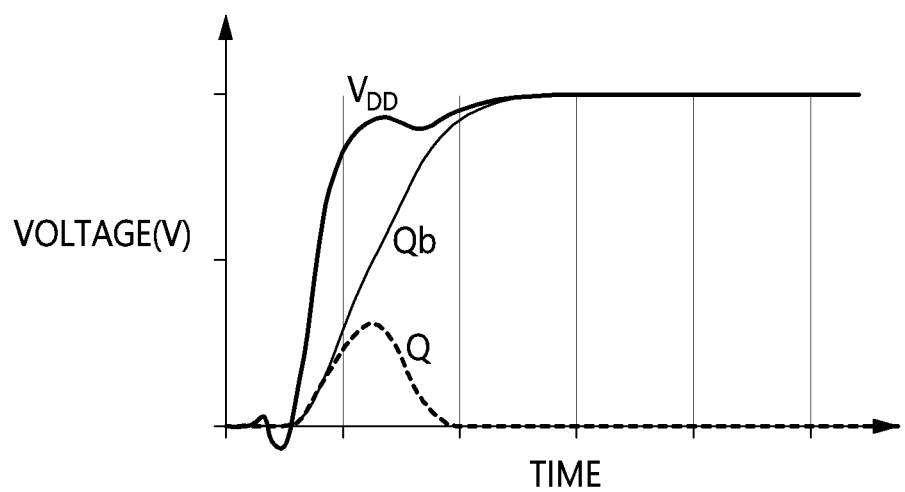

FIG. 13 is an exemplary view illustrating the initial state of a memory cell according to an embodiment, FIG. 14 is an exemplary view illustrating the transient state of a memory cell according to an embodiment, FIG. 15 and FIG. 17 are exemplary views illustrating the final state of a memory cell according to an embodiment, and FIG. 16 and FIG. 18 are the graphs of changes in voltages at an output terminal Q and an inverted output terminal Qb over time after a voltage is applied according to an embodiment.

Referring to FIG. 13, in the initial state, in which the voltage $V_{DD}$ applied to the gates of transistors is '0', which is a low level, the P-channel transistors PM1 and PM2 are turned on (the channels thereof are changed to an ON state), and the N-channel transistors NM1 and NM2 are turned off (the channels thereof are changed to an OFF state). Here, the values of the output terminal Q and the inverted output terminal Qb may be '0', which is a low level, so as to be equal to the power voltage $V_{DD}$.

Referring to FIG. 14, in the transient state, in which the voltage $V_{DD}$ applied to the gates of the transistors starts to increase from a low level '0' to a high level '1' over time after the voltage is applied, Qb and Q, which are the respective gate voltages of the N-channel transistors NM1 and NM2, increase from '0' to '1' so as to be equal to the power voltage.

However, because the N-channel transistors NM1 and NM2 have different threshold voltages, as described above, the transistor having the lower threshold voltage may be turned on (the channel thereof is changed to an ON state) first. Accordingly, the N-channel transistor, which is turned on first, turns off the other N-channel transistor by making the gate voltage thereof '0'.

That is, as illustrated in FIG. 15, when the first N-channel transistor NM1 has a threshold voltage higher than that of the second N-channel transistor NM2, the second N-channel transistor NM2 is turned on (the channel thereof is changed to an ON state) first. Accordingly, as illustrated in FIG. 16, the voltage at the inverted output terminal Qb decreases to '0', and the voltage applied to the gate of the first N-channel transistor NM1 becomes '0', whereby the first N-channel transistor NM1 is turned off (the channel thereof is changed to an OFF state).

Conversely, as illustrated in FIG. 17, when the second N-channel transistor NM2 has a threshold voltage higher than that of the first N-channel transistor NM1, the first N-channel transistor NM1 is turned on (the channel thereof is changed to an ON state) first. Accordingly, as illustrated in FIG. 18, the voltage at the output terminal Q decreases to '0', and the voltage applied to the gate of the second N-channel transistor NM2 becomes '0', whereby the second N-channel transistor NM2 is turned off (the channel thereof is changed to an OFF state).

When the symmetrically arranged transistors have identical threshold voltages, the values of the output terminal Q and the inverted output terminal Qb cannot be predicted, but when one of the transistors is replaced with a transistor having a higher threshold voltage, as described above, the values of the output terminal Q and the inverted output terminal Qb may be arbitrarily set. Accordingly, a camouflaged logic gate that operates as one of candidate logic gates depending on the values of the output terminal Q and the inverted output terminal Qb may be implemented.

Figure 19:
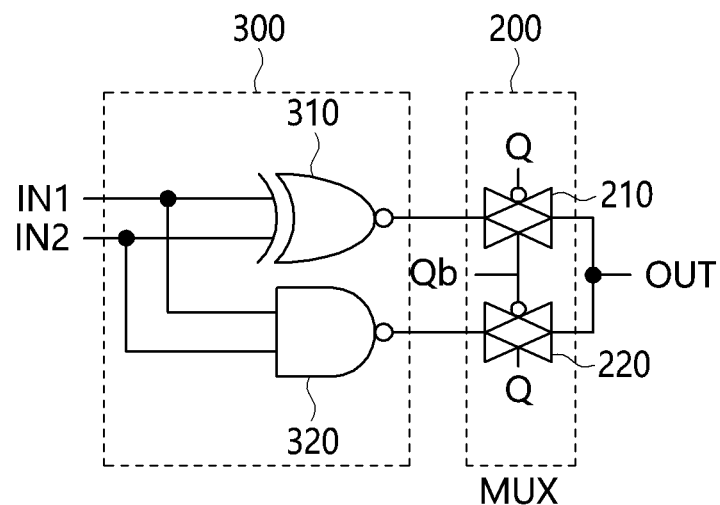
FIG. 19 is an exemplary view illustrating the structure of a multiplexer according to an embodiment.

FIG. 19 is an exemplary view illustrating the structure of a multiplexer according to an embodiment.

Referring to FIG. 19, the multiplexer 200 according to an embodiment may be configured with two transmission gates 210 and 220.

The first transmission gate 210 may switch a first candidate logic gate 310 by electrically connecting the control terminal thereof to the output terminal Q and the inverted output terminal Qb of a memory cell.

The second transmission gate 220 may switch a second candidate logic gate 320 by electrically connecting the control terminal thereof to the inverted output terminal Qb and the output terminal Q of the memory cell.

That is, depending on the signal of the memory cell, one of the first transmission gate 210 and the second transmission gate 220 is selectively switched on, and the other thereof is switched off, whereby the output value of one of the two logic gates 310 and 320 is output.

For example, as illustrated in FIG. 19, when the values of Q and Qb are '1' and '0', respectively, the NAND gate 320 may be selected, whereas when the values of Q and Qb are '0' and '1', respectively, the XNOR gate 310 may be selected.

Meanwhile, according to another embodiment, the multiplexer 200 and the candidate logic gates 300 may be implemented as a single-body structure optimized at a transistor level.

Figure 20:
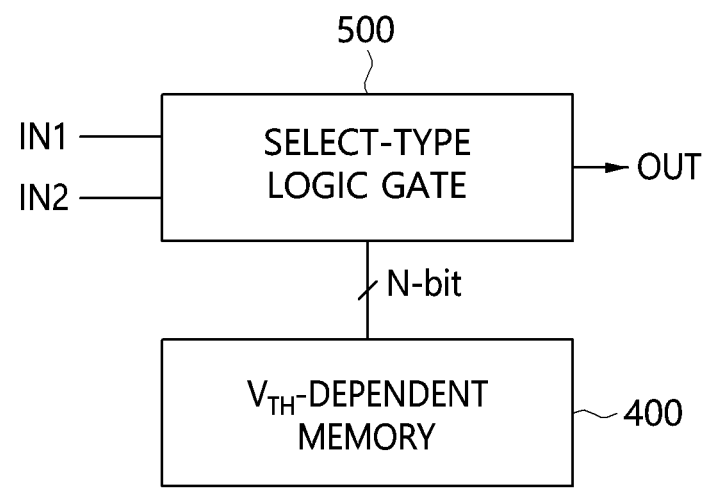
FIG. 20 is an exemplary view illustrating the structure of a memory-type camouflaged logic gate using transistors having different threshold voltages according to another embodiment.

FIG. 20 is an exemplary view illustrating the structure of a memory-type camouflaged logic gate using transistors having different threshold voltages according to another embodiment.

Referring to FIG. 20, the camouflaged logic gate according to another embodiment may include a memory cell 400 and a select-type logic gate 500.

The memory cell 400 may be configured such that the values of an output terminal Q and an inverted output terminal Qb are adjusted to a high level or a low level based on two or more transistors having different threshold voltages. The structure and operation of such a memory cell 400 are the same as described with reference to FIGS. 11 to 16, and thus a detailed description thereof will be omitted.

The select-type logic gate 500, configured with multiple transistors, outputs the result of a logic operation performed on input signals, and may selectively operate as one of two or more candidate logic gates depending on at least one of the signals of the output terminal Q and the inverted output terminal Qb of the memory cell 400. Although two inputs IN1 and IN2 are illustrated in FIG. 20, this is merely an example, and the present invention is not limited thereto.

That is, the types of the select-type logic gate 500 may be as shown in Table 3 below depending on the number of inputs according to an embodiment.

TABLE 3

| 2 input | 3 input |
|---|---|
| NAND-NOR | NAND-NOR |
| NAND-XOR | NAND-XOR |
| NOR-XOR | NOR-XOR |

Referring to Table 3, three types of select-type logic gate 500 may be configured by combining a NAND gate, a NOR gate, and an XOR gate, which are basic logic gates.

Also, the select-type logic gate 500 may have three or more inputs, but because a problem of the area, a delay time, or the like may occur, it may be desirable to have up to three inputs.

An example of the circuit of the select-type logic gate 500 will be described below. However, this is an example, and the present invention is not limited thereto. That is, another circuit configuration capable of selectively operating as shown in Table 3 depending on the data of the memory cell 400 by configuring transistors may also be included in the scope of the present invention.

Figure 21:
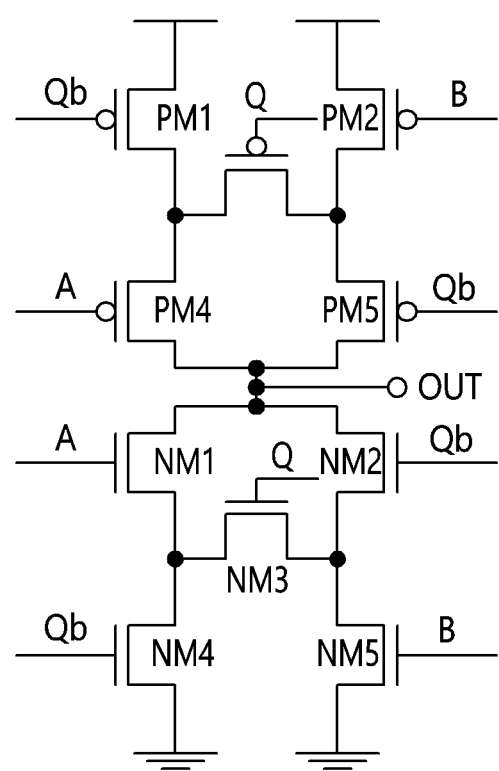
FIG. 21 is an exemplary view of a 2-input NAND-XOR select-type logic gate according to an embodiment.

FIG. 21 is an exemplary view of a 2-input NAND-NOR select-type logic gate according to an embodiment.

Referring to FIG. 21, the 2-input NAND-NOR select-type logic gate according to an embodiment may include first to fifth P-channel transistors PM1 to PM5 and first to fifth N-channel transistors NM1 to NM5.

Here, power may be applied to the source of the first P-channel transistor PM1 and to the source of the second P-channel transistor PM2, the drain of the first P-channel transistor PM1, the source of the third P-channel transistor PM3, and the source of the fourth P-channel transistor PM4 may be electrically connected to each other, the drain of the second P-channel transistor PM2, the drain of the third P-channel transistor PM3, and the source of the fifth P-channel transistor PM5 may be electrically connected to each other, and the drain of the fourth P-channel transistor PM4 and the drain of the fifth P-channel transistor PM5, which are connected to each other, may be connected to the output terminal OUT of the select-type logic gate.

Here, the drain of the first N-channel transistor NM1 and the drain of the second N-channel transistor NM2 may be electrically connected to the output terminal OUT of the select-type logic gate, the source of the first N-channel transistor NM1, the drain of the third N-channel transistor NM3, and the drain of the fourth N-channel transistor NM4 may be electrically connected to each other, the source of the second N-channel transistor NM2, the source of the third N-channel transistor NM3, and the drain of the fifth N-channel transistor NM5 may be electrically connected to each other, and the source of the fourth N-channel transistor NM4 and the source of the fifth N-channel transistor NM5 may be grounded.

Here, the first one (A) of two input signals may be input to respective gates of the fourth P-channel transistor PM4 and the first N-channel transistor NM1, and the second one (B) of the two input signals may be input to respective gates of the second P-channel transistor PM2 and the fifth N-channel transistor NM5.

Here, the output terminal Q of a memory cell may be electrically connected to the respective gates of the third P-channel transistor PM3 and the third N-channel transistor NM3, and the inverted output terminal Qb of the memory cell may be electrically connected to the respective gates of the first P-channel transistor PM1, the fifth P-channel transistor PM5, the second N-channel transistor NM2, and the fourth N-channel transistor NM4.

Accordingly, when the values of Q and Qb are '1' and '0' respectively or '0' and '1' respectively, the 2-input NAND-NOR select-type logic gate may operate as a 2-input NAND gate or a 2-input NOR gate by the channel on/off states of the transistors, the gates of which are connected to Q and Qb.

Figure 22:
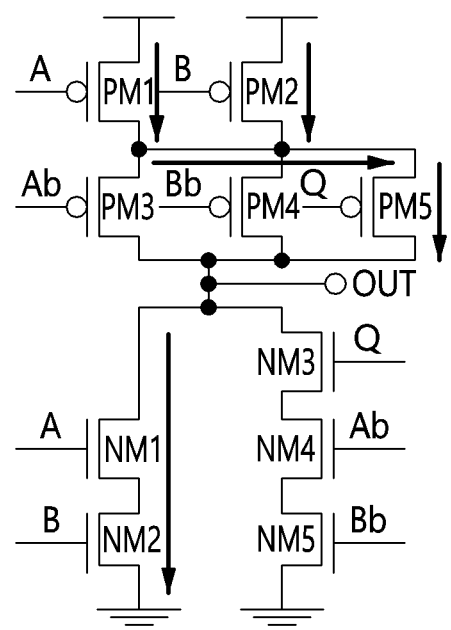
FIGS. 22 and 23 are exemplary views of a 2-input NAND-XOR select-type logic gate according to an embodiment.
Figure 23:
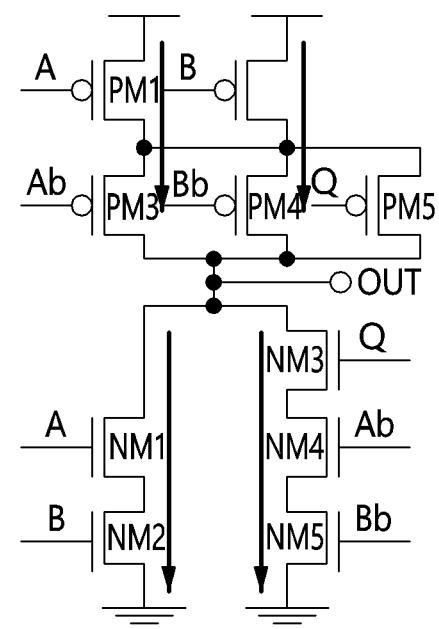

FIGS. 22 and 23 are exemplary views of a 2-input NAND-XOR camouflaged logic gate.

Referring to FIGS. 22 and 23, the 2-input NAND-XOR camouflaged logic gate may include first to fifth P-channel transistors PM1 to PM5 and first to fifth N-channel transistors NM1 to NM5.

Here, power may be applied to the source of the first P-channel transistor PM1 and to the source of the second P-channel transistor PM2, the drain of the first P-channel transistor PM1, the drain of the second P-channel transistor PM2, the source of the third P-channel transistor PM3, the source of the fourth P-channel transistor PM4, and the source of the fifth P-channel transistor PM5 may be electrically connected to each other, and the drain of the third P-channel transistor PM3, the drain of the fourth P-channel transistor PM4, and the drain of the fifth P-channel transistor PM5, which are electrically connected to each other, may form the output terminal OUT of the select-type logic gate.

Here, the drain of the first N-channel transistor NM1 and the drain of the third N-channel transistor NM3 may be electrically connected to the output terminal OUT of the select-type logic gate, the source of the first N-channel transistor NM1 and the drain of the second N-channel transistor NM2 may be electrically connected to each other, the source of the third N-channel transistor NM3 and the drain of the fourth N-channel transistor NM4 may be electrically connected to each other, the source of the fourth N-channel transistor NM4 and the drain of the fifth N-channel transistor NM5 may be electrically connected to each other, and the source of the second N-channel transistor NM2 and the source of the fifth N-channel transistor NM5 may be grounded.

Here, the first one (A) of two input signals may be input to the respective gates of the first P-channel transistor PM1 and the first N-channel transistor NM1, the inverted signal (Ab) of the first one of the two input signals may be input to the respective gates of the third P-channel transistor PM3 and the fourth N-channel transistor NM4, the second one (B) of the two input signals may be input to the respective gates of the second P-channel transistor PM2 and the second N-channel transistor NM2, and the inverted signal (Bb) of the second one of the two input signals may be input to the respective gates of the fourth P-channel transistor PM4 and the fifth N-channel transistor NM5.

Also, the output terminal Q of a memory cell may be electrically connected to the respective gates of the fifth P-channel transistor PM5 and the third N-channel transistor NM3.

Here, when the value of the output terminal Q is '0', the select-type logic gate may operate as a 2-input NAND gate in such a way that the circuit is connected as shown in FIG. 22.

Conversely, when the value of the output terminal Q is '1', the select-type logic gate may operate as a 2-input XOR gate in such a way that the circuit is connected as shown in FIG. 23.

Figure 24:
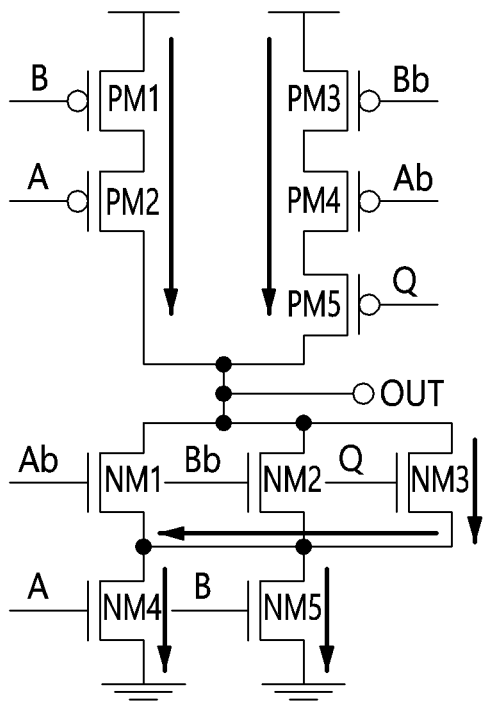
FIGS. 24 and 25 are exemplary views of a 2-input NOR-XOR select-type logic gate according to an embodiment.
Figure 25:
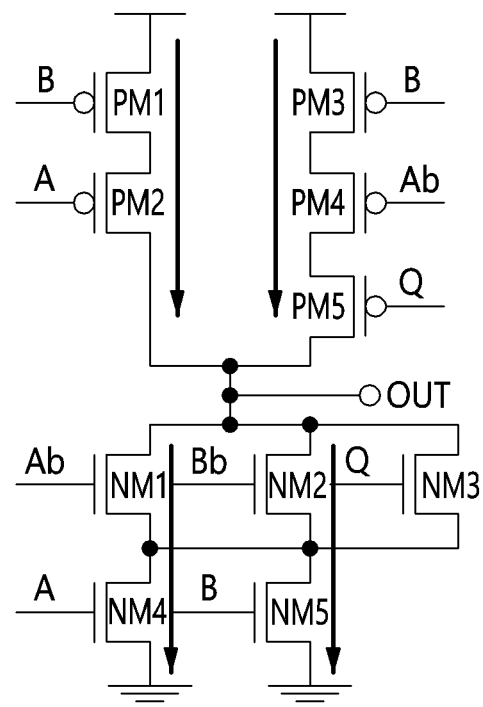

FIGS. 24 and 25 are exemplary views of a 2-input NOR-XOR camouflaged logic gate according to an embodiment.

Referring to FIG. 24 and FIG. 25, the 2-input NOR-XOR camouflaged logic gate according to an embodiment may include first to fifth P-channel transistors PM1 to PM5 and first to fifth N-channel transistors NM1 to NM5.

Here, power may be applied to the source of the first P-channel transistor PM1 and to the source of the third P-channel transistor PM3, the drain of the first P-channel transistor PM1 and the source of the second P-channel transistor PM2 may be electrically connected to each other, the drain of the third P-channel transistor PM3 and the source of the fourth P-channel transistor PM4 may be electrically connected to each other, the drain of the fourth P-channel transistor PM4 and the source of the fifth P-channel transistor PM5 may be electrically connected to each other, and the drain of the second P-channel transistor PM2 and the drain of the fifth P-channel transistor PM5, which are electrically connected to each other, may form the output terminal OUT of the select-type logic gate.

Here, the drain of the first N-channel transistor NM1, the drain of the second N-channel transistor NM2, and the drain of the third N-channel transistor NM3 may be electrically connected to the output terminal OUT of the select-type logic gate, the source of the first N-channel transistor NM1, the source of the second N-channel transistor NM2, the source of the third N-channel transistor NM3, the drain of the fourth N-channel transistor NM4, and the drain of the fifth N-channel transistor NM5 may be electrically connected to each other, and the source of the fourth N-channel transistor NM4 and the source of the fifth N-channel transistor NM5 may be grounded.

Here, the first one (A) of two input signals may be input to the respective gates of the second P-channel transistor PM2 and the fourth N-channel transistor NM4, the inverted signal (Ab) of the first one of the two input signals may be input to the respective gates of the fourth P-channel transistor PM4 and the first N-channel transistor NM1, the second one (B) of the two input signals may be input to the respective gates of the first P-channel transistor PM1 and the fifth N-channel transistor NM5, and the inverted signal (Bb) of the second one of the two input signals may be input to the respective gates of the third P-channel transistor PM3 and the second N-channel transistor NM2.

Also, the output terminal Q of a memory cell may be electrically connected to respective gates of the fifth P-channel transistor PM5 and the third N-channel transistor NM3.

Here, when the value of the output terminal Q is '0', the select-type logic gate may operate as a 2-input NOR gate in such a way that the circuit is connected as shown in FIG. 24.

Conversely, when the value of the output terminal Q is '1', the select-type logic gate may operate as a 2-input XOR gate in such a way that the circuit is connected as shown in FIG. 25.

Figure 26:
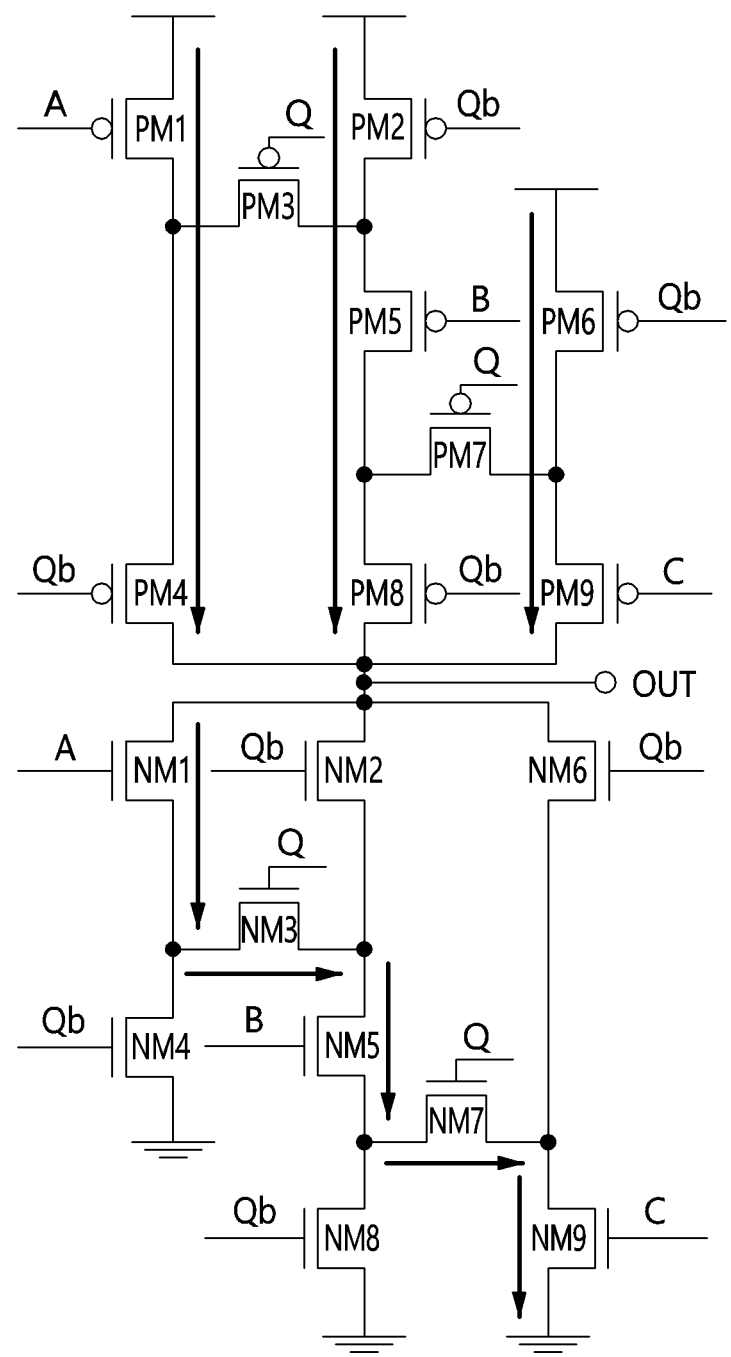
FIGS. 26 and 27 are exemplary views of a 3-input NAND-NOR select-type logic gate according to an embodiment.
Figure 27:
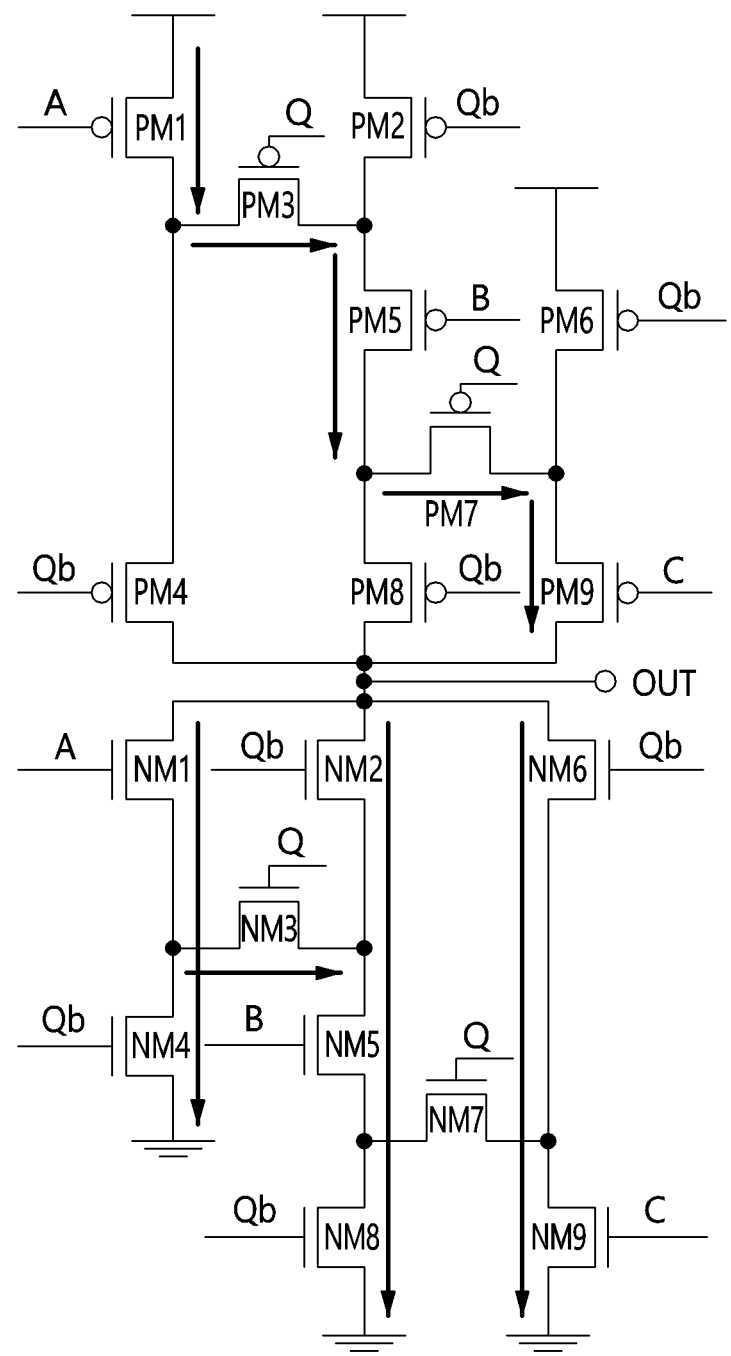

FIG. 26 and FIG. 27 are exemplary views of a 3-input NAND-NOR camouflaged logic gate.

Referring to FIG. 26 and FIG. 27, the select-type logic gate may include first to ninth P-channel transistors PM1 to PM9 and first to ninth N-channel transistors NM1 to NM9.

Here, power may be applied to the source of the first P-channel transistor PM1, the source of the second P-channel transistor PM2, and the source of the sixth P-channel transistor PM6, the drain of the first P-channel transistor PM1, the source of the third P-channel transistor PM3, and the source of the fourth P-channel transistor PM4 may be electrically connected to each other, the drain of the second P-channel transistor PM2, the drain of the third P-channel transistor PM3, and the source of the fifth P-channel transistor PM5 may be electrically connected to each other, the drain of the fifth P-channel transistor PM5, the source of the seventh P-channel transistor PM7, and the source of the eighth P-channel transistor PM8 may be electrically connected to each other, the drain of the sixth P-channel transistor PM6, the drain of the seventh P-channel transistor PM7, and the source of the ninth P-channel transistor PM9 may be electrically connected to each other, and the drain of the fourth P-channel transistor PM4, the drain of the eighth P-channel transistor PM8, and the drain of the ninth P-channel transistor PM9, which are electrically connected to each other, may form the output terminal OUT of the select-type logic gate.

Here, the drain of the first N-channel transistor NM1, the drain of the second N-channel transistor NM2, and the drain of the sixth N-channel transistor NM6 may be electrically connected to the output terminal OUT of the select-type logic gate, the source of the first N-channel transistor NM1, the drain of the third N-channel transistor NM3, and the drain of the fourth N-channel transistor NM4 may be electrically connected to each other, the source of the second N-channel transistor NM2, the source of the third N-channel transistor NM3, and the drain of the fifth N-channel transistor NM5 may be electrically connected to each other, the source of the fifth N-channel transistor NM5, the drain of the seventh N-channel transistor NM7, and the drain of the eighth N-channel transistor NM8 may be electrically connected to each other, the source of the sixth N-channel transistor NM6, the source of the seventh N-channel transistor NM7, and the drain of the ninth N-channel transistor NM9 may be electrically connected to each other, and the source of the fourth N-channel transistor NM4, the source of the eighth N-channel transistor NM8, and the source of the ninth N-channel transistor NM9 may be grounded.

Here, the first one (A) of three input signals may be input to the respective gates of the first P-channel transistor PM1 and the first N-channel transistor NM1, the second one (B) of the three input signals may be input to the respective gates of the fifth P-channel transistor PM5 and the fifth N-channel transistor NM5, and the third one (C) of the three input signals may be input to the respective gates of the ninth P-channel transistor PM9 and the ninth N-channel transistor NM9.

Here, the output terminal Q of a memory cell may be electrically connected to the respective gates of the third P-channel transistor PM3, the seventh P-channel transistor PM7, the third N-channel transistor NM3, and the seventh N-channel transistor NM7, and the inverted output terminal Qb of the memory cell may be electrically connected to the respective gates of the second P-channel transistor PM2, the fourth P-channel transistor PM4, the sixth P-channel transistor PM6, the eighth P-channel transistor PM8, the second N-channel transistor NM2, the fourth N-channel transistor NM4, the sixth N-channel transistor NM6, and the eighth N-channel transistor NM8.

Here, when the value of the output terminal Q of the memory cell is 1' and when the value of the inverted output terminal Qb thereof is '0', the 3-input NAND-NOR select-type logic gate may operate as a 3-input NAND gate in such a way that the circuit is connected as shown in FIG. 26.

Conversely, when the value of the output terminal Q of the memory cell is '0' and when the value of the inverted output terminal Qb thereof is '1', the 3-input NAND-NOR select-type logic gate may operate as a 3-input NOR gate in such a way that the circuit is connected as shown in FIG. 27.

According to the disclosed embodiment, a camouflage technique by which chip theft using reverse engineering is prevented may be provided.

According to the disclosed embodiment, constraints, such as a change in a circuit design process and the like, which are imposed when a conventional camouflage technique for preventing circuit theft in response to reverse engineering is applied to a general process, may be overcome.

According to the disclosed embodiment, an increase in the area of a chip, an increase in power consumption, and performance degradation due to a long delay time, which are caused due to a conventional camouflage technique for preventing circuit theft in response to reverse engineering, may be prevented.

According to the disclosed embodiment, interfacing with other logic may be facilitated through a static operation.

According to the disclosed embodiment, an increase in the price of a chip, which is incurred by a conventional camouflage technique for preventing circuit theft in response to reverse engineering, may be avoided.

Although embodiments of the present invention have been described with reference to the accompanying drawings, those skilled in the art will appreciate that the present invention may be practiced in other specific forms without changing the technical spirit or essential features of the present invention. Therefore, the embodiments described above are illustrative in all aspects and should not be understood as limiting the present invention.

What is claimed is:

1. A camouflaged logic gate comprising:
   two or more candidate logic gates;
   memory, an output signal of which is adjusted based on two or more transistors having different threshold voltages; and
   a multiplexer for selectively outputting an output of one of the two or more candidate logic gates depending on the output signal of the memory.

2. The camouflaged logic gate of claim 1, wherein, when the output signal of the memory is N bits, a number of candidate logic gates is equal to or less than $2^N$.

3. The camouflaged logic gate of claim 1, wherein:
   the memory includes at least one memory cell,
   the memory cell includes a first P-channel transistor, a second P-channel transistor, a first N-channel transistor, and a second N-channel transistor, and
   respective threshold voltages of the first P-channel transistor and the second P-channel transistor are different from each other, or respective threshold voltages of the first N-channel transistor and the second N-channel transistor are different from each other.

4. The camouflaged logic gate of claim 3, wherein the memory cell is configured such that:
   power is applied to respective sources of the first P-channel transistor and the second P-channel transistor,
   respective drains of the first P-channel transistor and the first N-channel transistor are electrically connected to each other, thereby forming an output terminal (Q),
   respective drains of the second P-channel transistor and the second N-channel transistor are electrically connected to each other, thereby forming an inverted output terminal (Qb),
   respective sources of the first N-channel transistor and the second N-channel transistor are grounded,
   the inverted output terminal (Qb) is electrically connected to respective gates of the first P-channel transistor and the first N-channel transistor, and
   the output terminal (Q) is electrically connected to respective gates of the second P-channel transistor and the second N-channel transistor.

5. The camouflaged logic gate of claim 4, wherein the multiplexer includes:
   a first transmission gate, configured such that a control terminal thereof is electrically connected to the output terminal (Q) and the inverted output terminal (Qb) of the memory cell, thereby switching a first candidate logic gate; and
   a second transmission gate, configured such that a control terminal thereof is electrically connected to the inverted output terminal (Qb) and the output terminal (Q) of the memory cell, thereby switching a second candidate logic gate.

6. A camouflaged logic gate comprising:
   a memory cell, configured such that values of an output terminal (Q) and an inverted output terminal (Qb) thereof are adjusted to a high level or a low level based on two or more transistors having different threshold voltages; and
   a select-type logic gate for selectively operating as one of two or more candidate logic gates depending on the values of the output terminal (Q) and the inverted output terminal (Qb) of the memory cell by being configured with multiple transistors.

7. The camouflaged logic gate of claim 6, wherein:
   the memory cell includes a first P-channel transistor, a second P-channel transistor, a first N-channel transistor, and a second N-channel transistor, and
   respective threshold voltages of the first P-channel transistor and the second P-channel transistor are different from each other, or respective threshold voltages of the first N-channel transistor and the second N-channel transistor are different from each other.

8. The camouflaged logic gate of claim 7, wherein the memory cell is configured such that:
   power is applied to respective sources of the first P-channel transistor and the second P-channel transistor, the drain of the first P-channel transistor and a drain of the first N-channel transistor are electrically connected to each other, thereby forming the output terminal (Q), the drain of the second P-channel transistor and a drain of the second N-channel transistor are electrically connected to each other, thereby forming the inverted output terminal (Qb), respective sources of the first N-channel transistor and the second N-channel transistor are grounded, the inverted output terminal (Qb) is electrically connected to respective gates of the first P-channel transistor and the first N-channel transistor, and the output terminal (Q) is electrically connected to respective gates of the second P-channel transistor and the second N-channel transistor.

9. The camouflaged logic gate of claim 6, wherein the select-type logic gate is configured to:

output a result of a logic operation performed on two input signals or three input signals, and selectively operate as one of a NAND gate and a NOR gate depending on at least one of signals of the output terminal (Q) and the inverted output terminal (Qb) of the memory cell.

10. The camouflaged logic gate of claim 9, wherein the select-type logic gate includes first to fifth P-channel transistors and first to fifth N-channel transistors, and is configured such that:

power is applied to a source of the first P-channel transistor and a source of the second P-channel transistor, a drain of the first P-channel transistor, a source of the third P-channel transistor, and a source of the fourth P-channel transistor are electrically connected to each other, a drain of the second P-channel transistor, a drain of the third P-channel transistor, and a source of the fifth P-channel transistor are electrically connected to each other, a drain of the fourth P-channel transistor, a drain of the fifth P-channel transistor, a drain of the first N-channel transistor, and a drain of the second N-channel transistor are electrically connected to each other, thereby forming an output terminal (OUT) of the select-type logic gate, a source of the first N-channel transistor, a drain of the third N-channel transistor, and a drain of the fourth N-channel transistor are electrically connected to each other, a source of the second N-channel transistor, a source of the third N-channel transistor, and a drain of the fifth N-channel transistor are electrically connected to each other, a source of the fourth N-channel transistor and a source of the fifth N-channel transistor are grounded, a first one (A) of the two input signals is input to respective gates of the fourth P-channel transistor and the first N-channel transistor, a second one (B) of the two input signals is input to respective gates of the second P-channel transistor and the fifth N-channel transistor, the output terminal (Q) of the memory cell is electrically connected to respective gates of the third P-channel transistor and the third N-channel transistor, and the inverted output terminal (Qb) of the memory cell is electrically connected to respective gates of the first P-channel transistor, the fifth P-channel transistor, the second N-channel transistor, and the fourth N-channel transistor.

11. The camouflaged logic gate of claim 9, wherein the select-type logic gate includes first to ninth P-channel transistors and first to ninth N-channel transistors, and is configured such that:

power is applied to a source of the first P-channel transistor, a source of the second P-channel transistor, and a source of the sixth P-channel transistor, a drain of the first P-channel transistor, a source of the third P-channel transistor, and a source of the fourth P-channel transistor are electrically connected to each other, a drain of the second P-channel transistor, a drain of the third P-channel transistor, and a source of the fifth P-channel transistor are electrically connected to each other, a drain of the fifth P-channel transistor, a source of the seventh P-channel transistor, and a source of the eighth P-channel transistor are electrically connected to each other, a drain of the sixth P-channel transistor, a drain of the seventh P-channel transistor, and a source of the ninth P-channel transistor are electrically connected to each other, a drain of the fourth P-channel transistor, a drain of the eighth P-channel transistor, a drain of the ninth P-channel transistor, a drain of the first N-channel transistor, a drain of the second N-channel transistor, and a drain of the sixth N-channel transistor are electrically connected to each other, thereby forming an output terminal (OUT) of the select-type logic gate, a source of the first N-channel transistor and a drain of the third N-channel transistor and a drain of the fourth N-channel transistor are electrically connected to each other, a source of the second N-channel transistor, a source of the third N-channel transistor, and a drain of the fifth N-channel transistor are electrically connected to each other, a source of the fifth N-channel transistor, a drain of the seventh N-channel transistor, and a drain of the eighth N-channel transistor are electrically connected to each other, a source of the sixth N-channel transistor, a source of the seventh N-channel transistor, and a drain of the ninth N-channel transistor are electrically connected to each other, a source of the fourth N-channel transistor, a source of the eighth N-channel transistor, and a source of the ninth N-channel transistor are grounded, a first one (A) of the three input signals is input to respective gates of the first P-channel transistor and the first N-channel transistor, a second one (B) of the three input signals is input to respective gates of the fifth P-channel transistor and the fifth N-channel transistor, a third one (C) of the three input signals is input to respective gates of the ninth P-channel transistor and the ninth N-channel transistor, the output terminal (Q) of the memory cell is electrically connected to respective gates of the third P-channel transistor, the seventh P-channel transistor, the third N-channel transistor, and the seventh N-channel transistor, and the inverted output terminal (Qb) of the memory cell is electrically connected to respective gates of the second P-channel transistor, the fourth P-channel transistor, the sixth P-channel transistor, the eighth P-channel transistor, the second N-channel transistor, the fourth N-channel transistor, the sixth N-channel transistor, and the eighth N-channel transistor.

12. The camouflaged logic gate of claim 6, wherein the select-type logic gate is configured to:
output a result of a logic operation performed on two input signals or three input signals, and
selectively operate as one of a NAND gate and an XOR gate depending on at least one of signals of the output terminal (Q) and the inverted output terminal (Qb) of the memory cell.

13. The camouflaged logic gate of claim 12, wherein the select-type logic gate includes first to fifth P-channel transistors and first to fifth N-channel transistors, and is configured such that:
power is applied to a source of the first P-channel transistor and a source of the second P-channel transistor,
a drain of the first P-channel transistor, a drain of the second P-channel transistor, a source of the third P-channel transistor, a source of the fourth P-channel transistor, and a source of the fifth P-channel transistor are electrically connected to each other,
a drain of the third P-channel transistor, a drain of the fourth P-channel transistor, a drain of the fifth P-channel transistor, a drain of the first N-channel transistor, and a drain of the third N-channel transistor are electrically connected to each other, thereby forming an output terminal (OUT) of the select-type logic gate,
a source of the first N-channel transistor and a drain of the second N-channel transistor are electrically connected to each other,
a source of the third N-channel transistor and a drain of the fourth N-channel transistor are electrically connected to each other,
a source of the fourth N-channel transistor and a drain of the fifth N-channel transistor are electrically connected to each other,
a source of the second N-channel transistor and a source of the fifth N-channel transistor are grounded,
a first one (A) of the two input signals is input to respective gates of the first P-channel transistor and the first N-channel transistor,
an inverted signal (Ab) of the first one of the two input signals is input to respective gates of the third P-channel transistor and the fourth N-channel transistor,
a second one (B) of the two input signals is input to respective gates of the second P-channel transistor and the second N-channel transistor,
an inverted signal (Bb) of the second one of the two input signals is input to respective gates of the fourth P-channel transistor and the fifth N-channel transistor, and
the output terminal (Q) of the memory cell is electrically connected to respective gates of the fifth P-channel transistor and the third N-channel transistor.

14. The camouflaged logic gate of claim 6, wherein the select-type logic gate is configured to:
output a result of a logic operation performed on two input signals or three input signals, and
selectively operate as one of a NOR gate and an XOR gate depending on at least one of signals of the output terminal (Q) and the inverted output terminal (Qb) of the memory cell.

15. The camouflaged logic gate of claim 14, wherein the select-type logic gate includes first to fifth P-channel transistors and first to fifth N-channel transistors, and is configured such that:
power is applied to a source of the first P-channel transistor and a source of the third P-channel transistor,
a drain of the first P-channel transistor and a source of the second P-channel transistor are electrically connected to each other,
a drain of the third P-channel transistor and a source of the fourth P-channel transistor are electrically connected to each other,
a drain of the fourth P-channel transistor and a source of the fifth P-channel transistor are electrically connected to each other,
a drain of the second P-channel transistor, a drain of the fifth P-channel transistor, a drain of the first N-channel transistor, a drain of the second N-channel transistor, and a drain of the third N-channel transistor are electrically connected to each other, thereby forming an output terminal (OUT) of the select-type logic gate,
a source of the first N-channel transistor, a source of the second N-channel transistor, a source of the third N-channel transistor, a drain of the fourth N-channel transistor, and a drain of the fifth N-channel transistor are electrically connected to each other,
a source of the fourth N-channel transistor and a source of the fifth N-channel transistor are grounded,
a first one (A) of the two input signals is input to respective gates of the second P-channel transistor and the fourth N-channel transistor,
an inverted signal (Ab) of the first one of the two input signals is input to respective gates of the fourth P-channel transistor and the first N-channel transistor,
a second one (B) of the two input signals is input to respective gates of the first P-channel transistor and the fifth N-channel transistor,
an inverted signal (Bb) of the second one of the two input signals is input to respective gates of the third P-channel transistor and the second N-channel transistor, and
the output terminal (Q) of the memory cell is electrically connected to respective gates of the fifth P-channel transistor and the third N-channel transistor.

* * * * *